(12) United States Patent
Guddat et al.

(10) Patent No.: US 6,366,990 B1
(45) Date of Patent: Apr. 2, 2002

(54) METHOD AND APPARATUS FOR SOFTWARE CONTROLLED TIMING OF EMBEDDED MEMORY

(75) Inventors: Douglas A. Guddat, Portland, OR (US); Glenn F. King, Folsom, CA (US); Tim Lambert, Aloha, OR (US); Navin Saxena, Beaverton, OR (US); Peter J. DesRosier, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/211,987

(22) Filed: Dec. 14, 1998

(51) Int. Cl.$^7$ ............................................... G06F 12/00
(52) U.S. Cl. .................... 711/167; 711/118; 714/718
(58) Field of Search ....................... 711/167, 118; 714/718

(56) References Cited

U.S. PATENT DOCUMENTS

| | | | |
|---|---|---|---|
| 5,237,224 A | * 8/1993 | DeLisle et al. | 307/603 |
| 5,249,281 A | * 9/1993 | Fuccio et al. | 395/425 |
| 5,579,326 A | * 11/1996 | McClure | 371/61 |
| 5,841,789 A | * 11/1998 | McClure | 371/22.1 |
| 5,930,182 A | * 7/1999 | Lee | 365/194 |

* cited by examiner

Primary Examiner—Kevin Verbrugge
(74) Attorney, Agent, or Firm—Blakely, Sokoloff, Taylor & Zafman LLP

(57) ABSTRACT

A method and apparatus for software controlled timing of embedded memory includes an embedded memory array and input/output (I/O) control circuitry coupled to the embedded memory array. The I/O control circuitry provides a plurality of I/O signals to the embedded memory array to control the input of data to the embedded memory array and output of data from the embedded memory array. The I/O control circuitry also includes programmable delay circuitry to alter the timing of the I/O signals.

16 Claims, 7 Drawing Sheets

METHOD AND APPARATUS FOR SOFTWARE CONTROLLED TIMING OF EMBEDDED MEMORY

BACKGROUND OF THE INVENTION

1. Field of the Invention

The present invention pertains to memories and memory testing. More particularly, this invention relates to software controlled timing of embedded memory.

2. Background

Continual advances in processor technology have led to continual increases in the functionality provided in a single processor chip. One example of such functionality is on-chip memories, often referred to as cache memories. On-chip cache memories provide storage of data and/or instructions as well as various other control and/or address information for use by the execution unit(s) and other internal logic of the processor. These on-chip cache memories are typically very fast memories, with the combination of their speed as well as their close physical locality to the execution unit(s) and other internal logic leading to fast memory accesses for the information stored in these memories.

However, the fabrication of memories does not produce perfect results and, therefore, processors will occasionally be fabricated which have faulty memories. The faults may be complete failure of the memory cells, failure of particular cells, failure only under certain circumstances, failure of connections between cells, failure of controlling circuits, etc. Therefore, given that processors with such faulty memories may be fabricated, it would be beneficial to provide a way to test the embedded memories to verify their performance. Unfortunately, given the embedded nature of these memories, it is typically not possible to easily alter the timing of control signals for accessing the memory from external to the processor, thereby making testing very difficult. Thus, the identification of the faulty part of the memory, as well as which control signals, if any, are contributing to the fault is difficult to detect.

Additionally, strict timing requirements for signals accessing memories leaves very little room for design flaws. Therefore, it is similarly important to designers to be able to easily analyze and evaluate designs for flaws, allowing the designers to quickly and accurately finalize the design of a chip.

Furthermore, in typical prior art systems even if a particular control signal can be identified as causing an improper result there is typically no way to programmably alter the timing of that signal to any precise degree on the chip. Typical solutions are to alter the timing of the control signal by changing the circuitry on the chip (e.g., adding or removing gate delays, capacitance, etc.) and fabricate a new chip with the altered timing. Such solutions, however, are expensive and can be very time consuming, especially if multiple iterations are necessary.

Thus, a need exists for improved testing of embedded memories.

SUMMARY OF THE INVENTION

A method and apparatus for software controlled timing of embedded memory is described herein. An apparatus is disclosed including an embedded memory array and input/output (I/O) control circuitry coupled to the embedded memory array. The I/O control circuitry provides a plurality of I/O signals to the embedded memory array to control the input of data to the embedded memory array and output of data from the embedded memory array. The I/O control circuitry also includes programmable delay circuitry to alter the timing of the I/O signals.

A method is disclosed including providing a plurality of input/output (I/O) signals to I/O circuitry associated with an embedded memory array. Additionally, the timing of one or more of the plurality of I/O signals is programmably altered to alter the delay of the one or more I/O signals.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, various aspects of the present invention will be described. However, it will be understood by those skilled in the art that the present invention may be practiced with only some or all aspects of the present invention. For purposes of explanation, specific numbers, materials and configurations are set forth in order to provide a thorough understanding of the present invention. However, it will also be apparent to those skilled in the art that the present invention may be practiced without these specific details.

In the descriptions which follow reference is made to logical zeroes and logical ones. A logical zero is often represented by a voltage of between 0.0 and 0.5 volts. When a particular signal or node is a logical zero, the signal or node is referred to as being low or in a low state. A logical one is often represented by a voltage of between 1.8 and 5.5 volts. When a particular signal or node is a logical one, the signal or node is referred to as being high or in a high state. It is to be appreciated, however, that the voltages which represent a logical zero or a logical one can be different than the ranges mentioned above.

Figure 1:
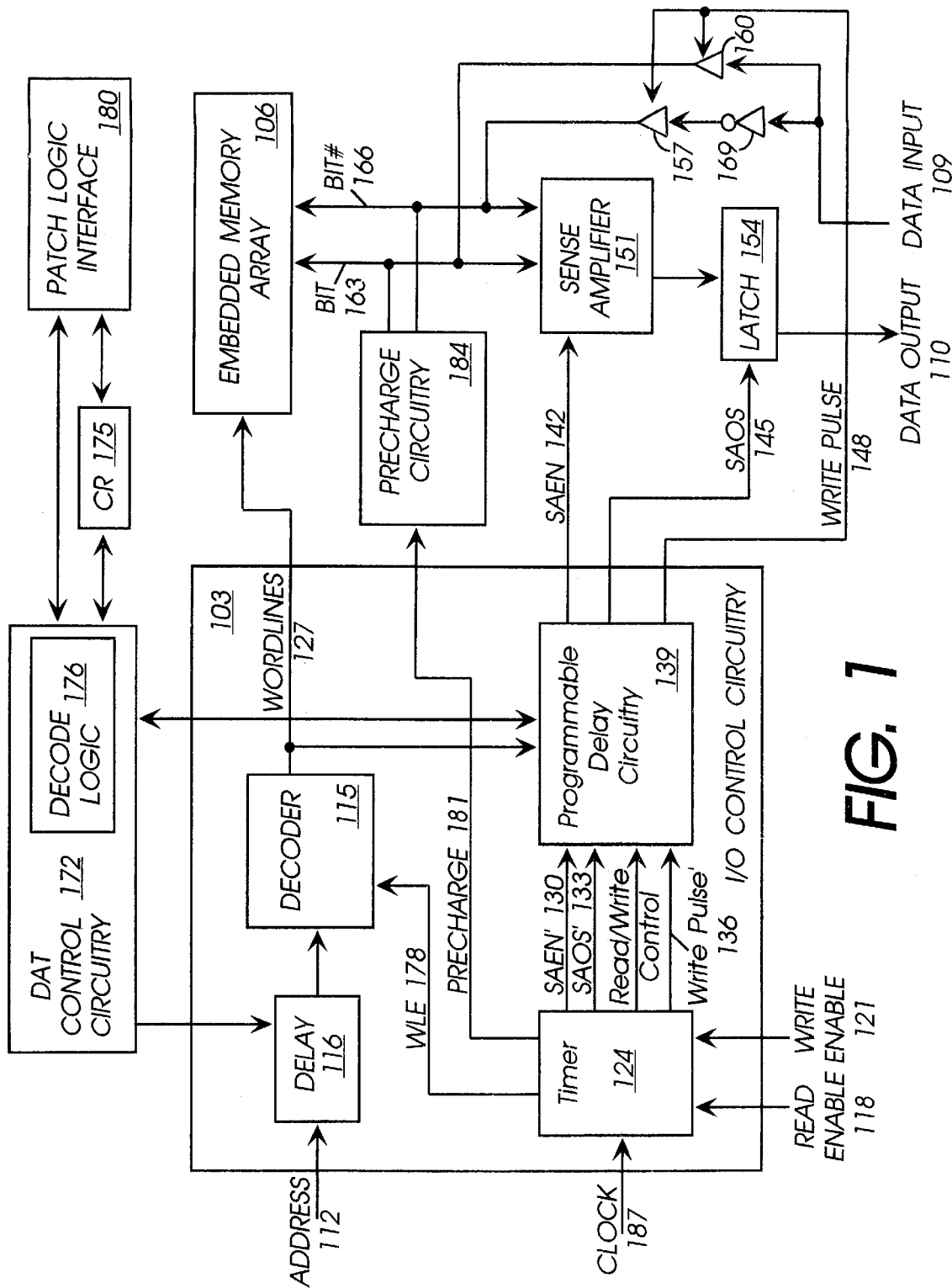
FIG. 1 is a block diagram illustrating an embedded memory array and associated circuitry according to one embodiment of the present invention.

FIG. 1 is a block diagram illustrating an embedded memory array and associated circuitry according to one embodiment of the present invention. In the discussions to follow reference is made to the embedded memory array and associated circuitry as being part of a processor. However, it is to be appreciated that the embedded memory array could be part of virtually any type of component.

Input/output (I/O) control circuitry 103 and an embedded memory array 106 are illustrated in FIG. 1. The I/O control circuitry 103 provides control signals to the embedded memory array 106, as well as I/O circuitry associated with the array 106, to control the input of data to and the output of data from the memory array 106 as data I/O 109 and 110. A clock signal 187 is provided to the I/O control circuitry 103 to clock the various components within the I/O control circuitry 103. In one implementation, the memory array 106 is an array of static random access memory (SRAM) cells. However, in alternate implementations array 106 is another type of memory array, such as read only memory, dynamic random access memory, etc.

In FIG. 1, the I/O circuitry for transferring a single bit of data to/from the array 106 is illustrated, including the sense amplifier 151, the latch 154, the precharge circuitry 184, the inverter 169, and the write drivers 157 and 160. It is to be appreciated that additional I/O circuitry is included for each additional bit which is to be concurrently transferred to/from the array 106.

During a write or read operation to or from the array 106, an address 112 is provided to a decoder 115 of I/O control circuitry 103. The source of the address 112 is internal to the processor, such as from a memory control circuitry or an external bus interface. The address 112 identifies a particular collection of memory cells of array 106 which is to be either read from or written to. A read enable signal 118 and a write enable signal 121 are provided to a timer circuitry 124 to indicate whether the address 112 is to be read from or written to. Analogous to address 112, the read enable and write enable signals 118 and 121 are received from a source internal to the processor. The decoder 115 decodes the address 112 and provides the appropriate signals to the array 106 to allow the addressed memory cell to be accessed. In the illustrated embodiment these signals are wordlines 127. In one implementation, the wordlines 127 comprise cache line identification signals. The wordlines 127 are provided to the array 106 in response to the wordline enable (WLE) signal 178 received from the timer 124.

The timer 124 controls the conventional timing signals provided to the sense amplifier 151, the latch 154, the precharge circuitry 184, and the write drivers 157 and 160 to transfer data into and out of the array 106. The timer 124 provides a preliminary sense amplifier enable signal 130 (SAEN'), a preliminary sense amplifier output strobe signal 133 (SAOS'), and a preliminary write pulse' signal 136 to programmable delay circuitry 139. The programmable delay circuitry 139 introduces a programmable delay to each of the signals, as discussed in more detail below. The delay introduced to each of the signals 130, 133, and 136 can be varied differently for each signal. Alternatively, rather than using the three separate signals 130, 133, and 136, the present invention could vary the delays based on the word line enable (WLE) signal.

The programmable delay circuitry 139 provides a sense amplifier enable signal 142 (SAEN) to the sense amplifier 151 to control the turning on of the sense amplifier 151 during read operations. Additionally, the programmable delay circuitry 139 provides a sense amplifier output strobe signal 145 (SAOS) to the output latch 154 to control when the output latch 154 turns off during read operations. The programmable delay circuitry 139 also provides a write pulse signal 148 to write drivers 157 and 160 to control when data is provided to the memory array 106 during a write operation.

Prior to a read operation of a particular cell, the timer 124 asserts a precharge signal 181 to precharge circuitry 184, which in turn precharges the bit and bit# signals 163 and 166 to Vcc. The precharge signal 181 is then de-asserted and the wordlines 127 are asserted. The value of the cell is then output from array 106 as bit signal 163 and the inverse of the value of the cell is output from array 106 as bit# signal 166. Bit signal 163 and bit# signal 166 are both input to sense amplifier 151, which in turn identifies the actual value of the cell based on the voltage differential between the bit signal 163 and bit# signal 166. The storage of logic values in memory cells and the identification of the stored values using a sense amplifier are well known to those skilled in the art, and thus will not be discussed further except as they pertain to the present invention.

The sense amplifier 151 is enabled to sense the value of the particular cell upon receiving an active SAEN signal 142. The sensed value is then output by the sense amplifier 151 to the output latch 154. The output latch 154 propagates the sensed value received from sense amplifier 151 as the output data 110 while the SAOS signal 145 is at a high level (e.g., equivalent to a logical one), and then retains the input value when the SAOS signal 145 transitions to a low level (e.g., equivalent to a logical zero).

During a write operation, the input data 109 is received and provided to the write driver 160. The write driver 160, during receipt of an active write pulse 148, drives the input data 109 to the particular cell of the array 106 being written to (as identified by the wordlines 127) as the bit signal 163. The input data 109 is also provided to an inverter 169, which operates in a conventional manner to invert the input data. The inverted data is then provided to the write driver 157 which, during receipt of an active write pulse 148, drives the inverted input data to the particular cell of the array 106 being written to (as identified by the wordlines 127) as the bit# signal 166. The write pulse 148 remains active for a period of time sufficient to allow the data to be stored in the appropriate cell of array 106, at which time the wordlines 127 and the write pulse 148 are de-asserted.

According to one embodiment of the present invention, the programmable delay circuitry 139 is one or more multiple-bit registers. The number of bits in each of the one or more registers typically ranges from 40 to 128. The exact number of bits to use is a design choice, balancing between the chip real estate required for the register and the desired granularity of control for the delays.

In the illustrated embodiments, programmable cells of two different sizes are used. In alternate embodiments, three or more different sized cells can be used.

Additionally, in alternate embodiments of the present invention different types of programmable delay circuitry can be used. By way of example, different register bits (as discussed above) can be used, or alternatively conventional gate delays can be used.

According to one embodiment, there is one multiple-bit register for each signal which is to be programmably controlled. Thus, in the illustrated embodiment of FIG. 1, there are three multiple-bit registers, one to alter the timing (either speed up or slow down) of SAEN signal 142, one to alter the timing of SAOS signal 145, and one to alter the timing of write pulse signal 148.

FIG. 1 also illustrates direct access test (DAT) control circuitry 172 and a control register (CR) 175, which provides access to the programmable delay circuitry 139. The delay imposed on a signal by the delay circuitry 139 can be altered using software via the CR 175. According to one embodiment, the DAT control circuitry 172 includes decode logic 176 to decode commands received from a source external to the processor for programming and reading the register(s) of the delay circuitry 139. Delay register read and write commands are received by the DAT control circuitry 172 and, depending on the particular commands and the various settings of the CR 175, are forwarded to the appropriate delay register.

The delay registers can be written to and read from one bit at a time (that is, in a serial fashion). In order to write to or read from a delay register, the cell to be accessed is identified in the CR 175, as well as the data to be written (if any). The write or read command is then provided to the DAT control circuitry 172, which uses the cell information and data (if any) in the CR 175 in accessing the appropriate delay register. Thus, it can be seen that the multiple-bit registers of the delay circuitry can be easily altered by software writing to the CR 175.

FIG. 1 also illustrates patch logic interface 180, which provides access to the programmable delay circuitry 139 via the CR 175. The interface 180 includes decode logic to decode commands received from a microcode patch for programming and reading the register(s) of the delay circuitry 139. Similar to the DAT control circuitry 172, the patch logic interface 180 allows the settings of the delay register to be changed by writing to the CR 175.

Figure 2:
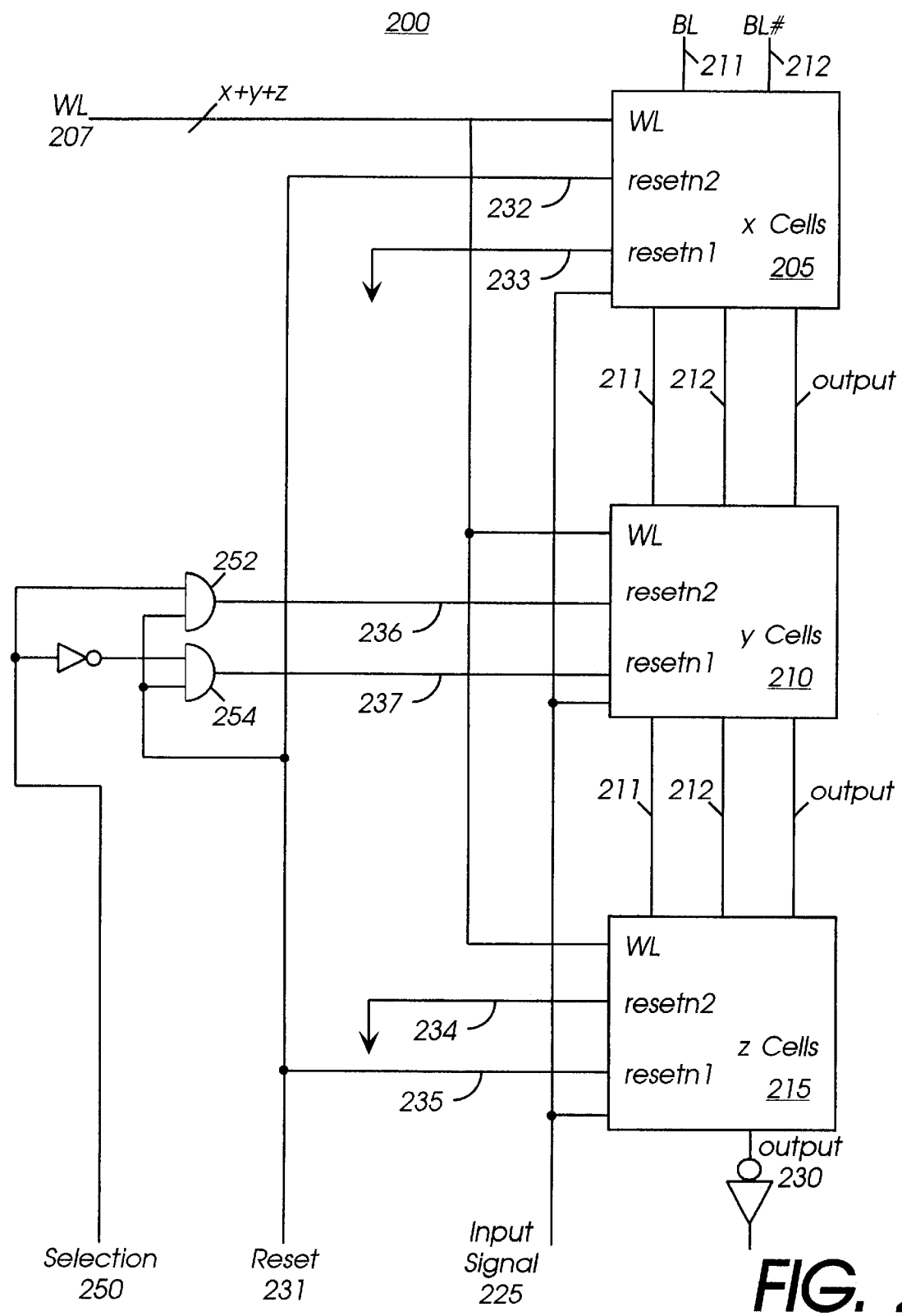
FIG. 2 is a block diagram of a programmable multiple-bit register according to one embodiment of the present invention.

FIG. 2 is a block diagram of a programmable multiple-bit register according to one embodiment of the present invention. According to one implementation, register 200 of FIG. 2 is one of the multiple-bit registers of delay circuitry 139. As illustrated, the register 200 includes x cells 205, y cells 210, and z cells 215, with each cell being capable of storing one bit. According to one implementation, x is equal to 37, y is equal to 4, and z is equal to 87, so the register 200 is a 128-bit register. It should be noted that the number of cells in each of the cell groups 205, 210 and 215 can be changed (e.g., by the via programming of the chip).

In the illustrated embodiment, the cells of register 200 are illustrated as being in column pitch (that is, a column of cells). According to alternate embodiments, the cells are laid out in any of a wide variety of conventional configurations. Also in the illustrated embodiment, the cells of register 200 are illustrated as being SRAM cells. However, according to alternate embodiments, different types of memory cells can be used.

Multiple select lines 207 (also referred to as "word lines") are input to the register 200 with one word line 207 corresponding to each cell of the register 200. Any one of the cells 205, 210, and 215 can be selected for programming by enabling the corresponding word line 207. The value to be programmed in the cell is placed on a bit line 211 and the inverse of the value to be programmed in the cell is placed on a bit# line 212 as a result of write pulse 148 being asserted and valid data present on 109. The bit line 211 and the bit# line 212 is input to each of the cells 205, 210, and 215. Thus, a particular value can be written to any of the cells by placing the particular value on the bit line 211, the inverse of the particular value on the bit# line 212, and then asserting the word line 207 and write pulse 148 for the cell that is to be programmed.

The cells 205, 210, and 215 receive an input signal 225, which can be any one of the SAEN' signal 130, the SAOS' signal 133, or the write pulse' signal 136 of FIG. 1. An output signal 230 from the register 200 rises and falls tracking the rising and falling of the input signal 225 provided to the register 200. However, the output signal 230 is delayed by a period of time which is dependent on the programming of the register 200.

Additionally, the register 200 can be read from in a conventional manner in order to ascertain the current settings of the register 200. As discussed above, this reading is done on a single-bit basis. In order to read from a particular cell, the appropriate select lines 207 are asserted to identify the particular cell, with the bit line 211 and bit# line 212 providing the output data (that is, the value stored in the cell).

Figure 3:
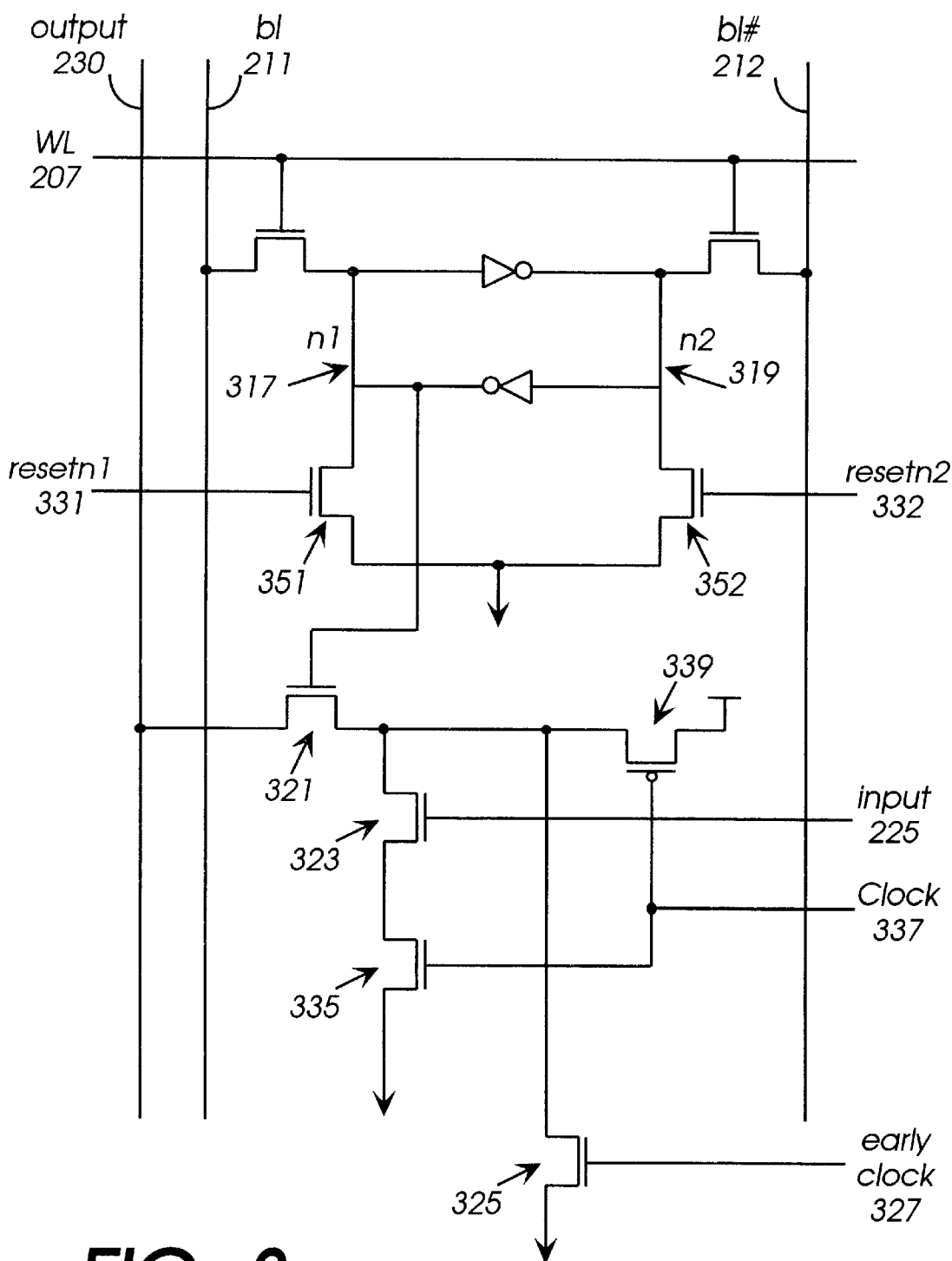
FIG. 3 is a diagram illustrating a cell of the multiple-bit register of FIG. 2 according to one embodiment of the present invention.

FIG. 3 is a diagram illustrating a cell of the register 200 according to one embodiment of the present invention. As discussed above, the value to be programmed in the cell is placed on a bit line 211 and the inverse of the value to be programmed in the cell is placed on a bit# line 212. Upon enabling the word line 207, the value to be programmed in the cell is input to the cell, with a node 317 (n1) being at the programmed value and a node 319 (n2) being at the inverse of the programmed value.

As can be seen in FIG. 3, programming the cell 300 to the logical value of one causes the node 317 to have a value of one, thereby causing the transistor 321 to turn on. When the clock signal 337 is at a low level (clock signal 337 is a version of the clock signal 187 of FIG. 1 in phase with and earlier than input signal 225), the transistor 339 is turned on, causing the output signal 230 to be at a high level. However, when the input signal 225 transitions to a high level, the transistor 323 turns on, and when the clock signal 337 transitions to a high level, the transistor 335 turns on and the transistor 339 turns off. Transistors 321, 323, and 335 being on causes the output signal 230 to transition to a low level. It is to be appreciated that the greater the number of cells 300 which are programmed to the value of one, the greater the number of cells that are working to transition the output signal 230 to a low level when the input signal 225 transitions to a high level. Thus, the delay between the rise of the input signal 225 and the fall of output signal 230 is smaller as the number of cells which are programmed to the value of one increases.

Similarly, when the clock signal 337 transitions to a low level, the transistor 339 turns on and the transistor 335 turns off. Thus, the output 230 is connected to $V_{cc}$ rather than ground. If the transistor 321 is turned on, then the cell 300 causes the output signal 230 to transition to a high level. The output 230 can also be precharged via additional, stronger, precharge circuitry (not shown).

Additionally, as illustrated in FIG. 3, cell 300 may optionally include an additional pull-down transistor 325 in parallel with transistor 323. The transistor 325 is coupled to an early clock signal 327 that is a delayed version of the clock signal 337. The transistor 325 can be used in situations where, even when all of the cells 205, 210, and 215 of FIG. 2 are programmed to provide the smallest delay possible, this small delay may still be insufficient to meet the range requirements for use of the programmable delay of the present invention. Thus, the delay can be made even smaller by asserting early clock signal 327 prior to the assertion of input signal 225. Thus transistors 321 and 325 both being on causes the output signal 230 to transition to a low level sooner than it would due to transistors 321 and 323 both being on because transistor 325 turns on earlier than transistor 323.

In the illustrated embodiment of FIG. 2, the cells 205, 210, and 215 can also be programmed through the use of a delay reset signal 231. The delay reset signal 231 is different from the system reset signal commonly found in computer systems, and is used to set the delay to a "preset" state. Each of the cells 205, 210, and 215 includes a resetn1 signal to reset a first node of each cell (e.g., node 317 (n1) of FIG. 3), and a resetn2 signal to reset a second node of each cell (e.g., node 319 (n2) of FIG. 3). As illustrated, the cells 205 receive resetn1 233 and resetn2 232 signals, while the cells 210 receive resetn1 237 and resetn2 236 signals, and the cells 215 receive resetn1 235 and resetn2 234 signals. The resetn1 signal 233 and the resetn2 signal 234 are tied to ground, whereas the resetn2 signal 232 and the resetn1 signal 235 are tied to the reset signal 231. Assertion of the reset signal 231 causes the cells 205 to be reset to a logical value of one and the cells 215 to be reset to a logical value of zero.

The programming of cells using the reset signal 231 can be illustrated in more detail in FIG. 3. In situations where the resetn1 signal 331 is tied to ground and the resetn2 signal 332 is tied to the reset signal 231 (e.g., one of the cells 205 of FIG. 2), assertion of the resetn2 signal 332 causes the transistor 352 to turn on and the node 319 to transition to the logical value of zero. The node 319 being at a logical value of zero causes the node n1 to be at a logical value of one, so the cell 300 is programmed to the value of one.

Similarly, in situations where resetn2 signal 332 is tied to ground and the resetn1 signal 331 is tied to the reset signal 231 (e.g., one of the cells 215 of FIG. 2), assertion of the resetn1 signal 331 signal causes the transistor 351 to turn on and the node 317 to be programmed to the value of zero. Thus, the cell 300 is programmed to the value of zero.

Thus, upon assertion of the reset signal 231 of FIG. 2, each of the cells 205 is programmed to the value of one while each of the cells 215 is programmed to the value of zero. It should be noted that, when using the reset signal 231, cells are programmed in groups rather than individually. However, after programming by assertion of the reset signal 231, individual cells can be subsequently reprogrammed using the word lines 207, after the reset signal 231 is de-asserted.

Additionally, according to one embodiment, the present invention can be preconfigured for different system presets (e.g., a "high voltage" configuration and a "low voltage" configuration). These different presets can be accomplished by programming the cells 210 to either a value of zero or a value of one. The programming of the cells 210 using the reset signal 231 is also dependent on the value of an adjustment selection signal 250. According to one implementation, selection signal 250 is at a high logic value for a "high voltage" definition, and at a low logic value for a "low voltage" definition. Selection signal 250 and reset signal 231 are input to logical AND gate 252, the output of which is the resetn2 signal 236. Reset signal 231 and the inverse of selection signal 250 are input to logical AND gate 254, the output of which is the resetn1 signal 237. Thus, when the selection signal 250 is at a high logic value, the cells 210 are programmed to a value of one (the same as cells 205). However, when the selection signal 250 is at a low logic value, the cells 210 are programmed to a value of zero (the same as cells 215).

In the illustrated embodiment, the default programming values for the register 200 are obtained by asserting the reset signal 231. Assertion of the reset signal 231 results in the cells 205 being programmed to one while the cells 210 are programmed to zero, so additional delay can be introduced to a signal by the register 200 by programming one or more of the cells 205 to the value of zero. Similarly, delay of a signal can be reduced by the register 200 by programming one or more of the cells 210 to the value of one.

According to one embodiment of the present invention, the programmable delay circuitry 139 is reset to the default programming values at each system reset. However, it is to be appreciated that the circuitry 139 can be re-programmed after system reset with any desired values. This re-programming can be done in any of a wide variety of manners, including a series of software instructions stored in a system microcode patch or vectors from a tester.

According to one embodiment of the present invention, one or more of the embedded memory arrays of a processor include the programmable delay circuitry of the present invention. According to one embodiment, the data cache unit, instruction fetch unit, and branch target buffer memory arrays of a processor include the programmable delay circuitry of the present invention. It is to be appreciated that additional embedded arrays could include the circuitry of the present invention, or that some of the embedded arrays may not be included. Which embedded arrays are to include the circuitry of the present invention is a balance between the additional chip space required for the circuitry of the present invention and the additional signal control provided by the present invention.

According to one implementation, each embedded memory which uses the present invention includes a different multiple-bit programmable delay register for each of the SCT modes (delay mode, strobe mode, and write mode) which the embedded memory is to use.

Returning to FIG. 1, each programmable delay register of the delay circuitry 139 can be accessed via the CR 175 according to one implementation. The CR 175 includes multiple fields which store various control information and data for programming a delay register of circuitry 139. The fields of the CR 175 according to one embodiment of the present invention are illustrated in Table I below.

TABLE I

| Field | Contents |
|---|---|
| Address Mode Enable | Individually enables or disables each address delay in an embedded memory array. |
| Address Mode Delay | Controls the amount of delay for one or more address delay. |
| Mode Enable | Identifies whether the programmable delay register is to be set to the default values or programmable values. |
| Timer Select | Identifies which embedded memory array timer is to be accessed. |
| Write Enable | Identifies which programmable delay register is to receive the data in the Data In field. |
| Data In | Stores a single bit to be written to a cell of a programmable delay register. |
| Data Out | Stores a single bit read from a programmable delay register. |

The address mode enable provides a mechanism for delaying the address 112 input to the decoder 115. By delaying the address 112, the address 112 to embedded memory array 106 path becomes the critical path for the access time of the array 106 (that is, the time delay from the receipt of address 112 by the decoder 115 to the output of valid data by the sense amplifier 151). Additional delay circuitry 116 is included in the I/O control circuitry 103 to provide this delay. Any of a wide variety of conventional delay circuits can be used as delay circuitry 116. Alternatively, a programmable register analogous to those in programmable delay circuitry 139 can be used as delay circuitry 116.

Figure 4:
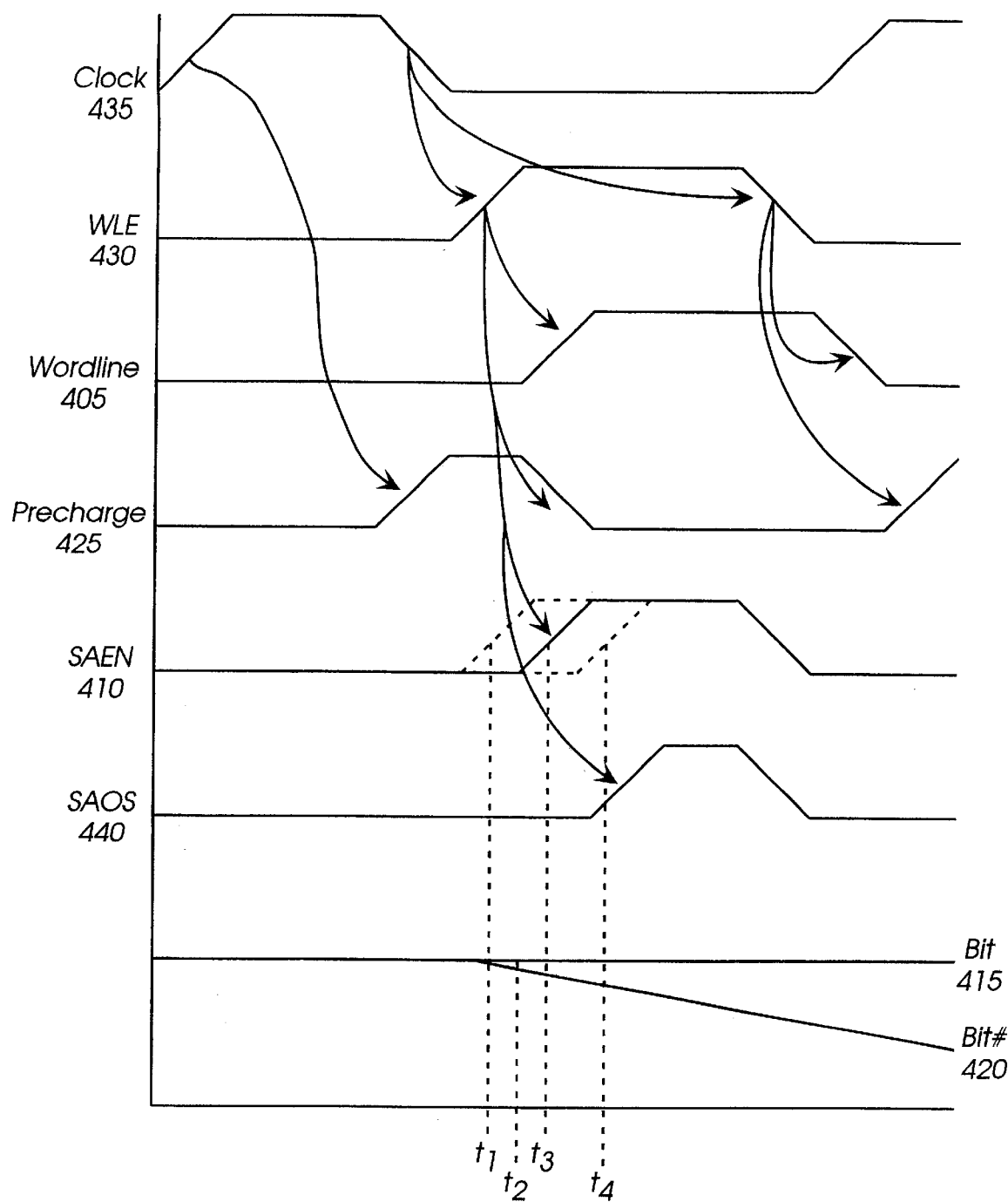
FIG. 4 is a timing diagram illustrating the timing of a programmably delayed sense amplifier enable signal according to one embodiment of the present invention.

FIG. 4 is a timing diagram illustrating the timing of a programmably delayed sense amplifier enable signal according to one embodiment of the present invention. Variation of the read margin, discussed below, by varying the sense amplifier enable timing is referred to as the software controlled timing (SCT) delay mode of the present invention.

A wordline signal 405, SAEN signal 410, bit signal 415, bit# signal 420, precharge signal 425, wordline enable signal 430, clock signal 435, and SAOS signal 440 are illustrated in FIG. 4. In the illustrated embodiment, the wordline signal 405, the SAEN signal 410, the bit signal 415, the bit# signal 420, the precharge signal 425, the wordline enable signal 430, the clock signal 435, and the SAOS signal 440 of FIG. 4 are the wordline signal 127, the SAEN signal 142, the bit signal 163, the bit# signal 166, the precharge signal 181, the wordline enable signal 178, the clock signal 187, and the SAOS signal 145 of FIG. 1, respectively.

During a read operation of the array 106 of FIG. 1, the wordline enable signal 430 is provided to the decoder, which causes the wordline signal 405 to be provided to the particular memory cell to be read. The wordline enable signal 430 also causes de-assertion of the precharge signal 425 and assertion of the SAEN signal 410. The wordline signal 405 causes the cell to transition the bit signal 415 to the programmed value of the particular cell and the bit# signal 420 to the inverse of the programmed value of the particular cell. As is well-known in the art, the transition of the bit signal 415 and the bit# signal 420 to their final states is not instantaneous. Rather, a transition time for the signals is incurred.

A period of time after assertion of the wordline enable signal 430, the SAEN signal 410 is asserted. Assertion of the SAEN signal 410 causes the sense amplifier 151 of FIG. 1 to sense the voltage differential between the bit signal 415 and the bit# signal 420 and output the value sensed as stored in the memory cell being read. If the SAEN signal 410 is asserted too early, then the sense amplifier 151 will not reliably sense the value stored in the memory cell.

The default time at which the SAEN signal 410 is asserted is time $t_3$ in FIG. 4. However, the earliest time at which the sense amplifier could reliably sense the value stored in the memory cell is at the time $t_2$. The difference between time $t_3$ and time $t_2$ is referred to as the read margin. The read margin exists typically because it is not possible to know accurately during the design process exactly where the minimum time $t_2$ exists. Slight variations in the fabrication process, due to for example temperature or materials differences, can cause minor changes to the location of the time $t_2$ which cannot be predicted by the designer. Thus, additional margin for error, the read margin, is added to allow a product to function properly despite some of these minor process variations.

Using the programmable delay circuitry of the present invention, the timing of the assertion of the SAEN signal 410 can be altered. Additional delay can be introduced to the SAEN signal 410 so that the SAEN signal 410 is not asserted until time $t_4$. Thus, if the sense amplifier were unable to reliably sense the value stored in the memory cell at the time $t_3$, due to for example a particular process variation or improperly designed component, additional delay can be introduced to the SAEN signal 410 to allow the memory to still function properly. Note that by delaying the SAEN signal 410 the data from the memory cell will be supplied later than if the SAEN signal 410 had not been delayed.

Furthermore, delay can be removed from the SAEN signal 410 so that the SAEN signal 410 is asserted at time $t_1$. This would result in a reduction of the read margin, however, it would also result in the data from the memory cell being read being supplied by the sense amplifier faster than if the SAEN signal 410 had been enabled at time $t_3$. In one implementation, when removing delay from the SAEN signal 410, it is possible that too much delay may be removed such that the time $t_1$ is prior to the time $t_2$. Thus, care should be taken when removing delay from the SAEN signal 410 to ensure that the SAEN signal 410 is not asserted before the time $t_2$.

It should be noted that a range of delays could be programmably added by the present invention to cause the SAEN signal 410 to be asserted at any one of multiple times between time $t_1$ and $t_4$ of FIG. 4. In the embodiment discussed above with a 128-bit register, 128 different times between $t_1$ and $t_4$, inclusive, can be programmed.

Figure 5:
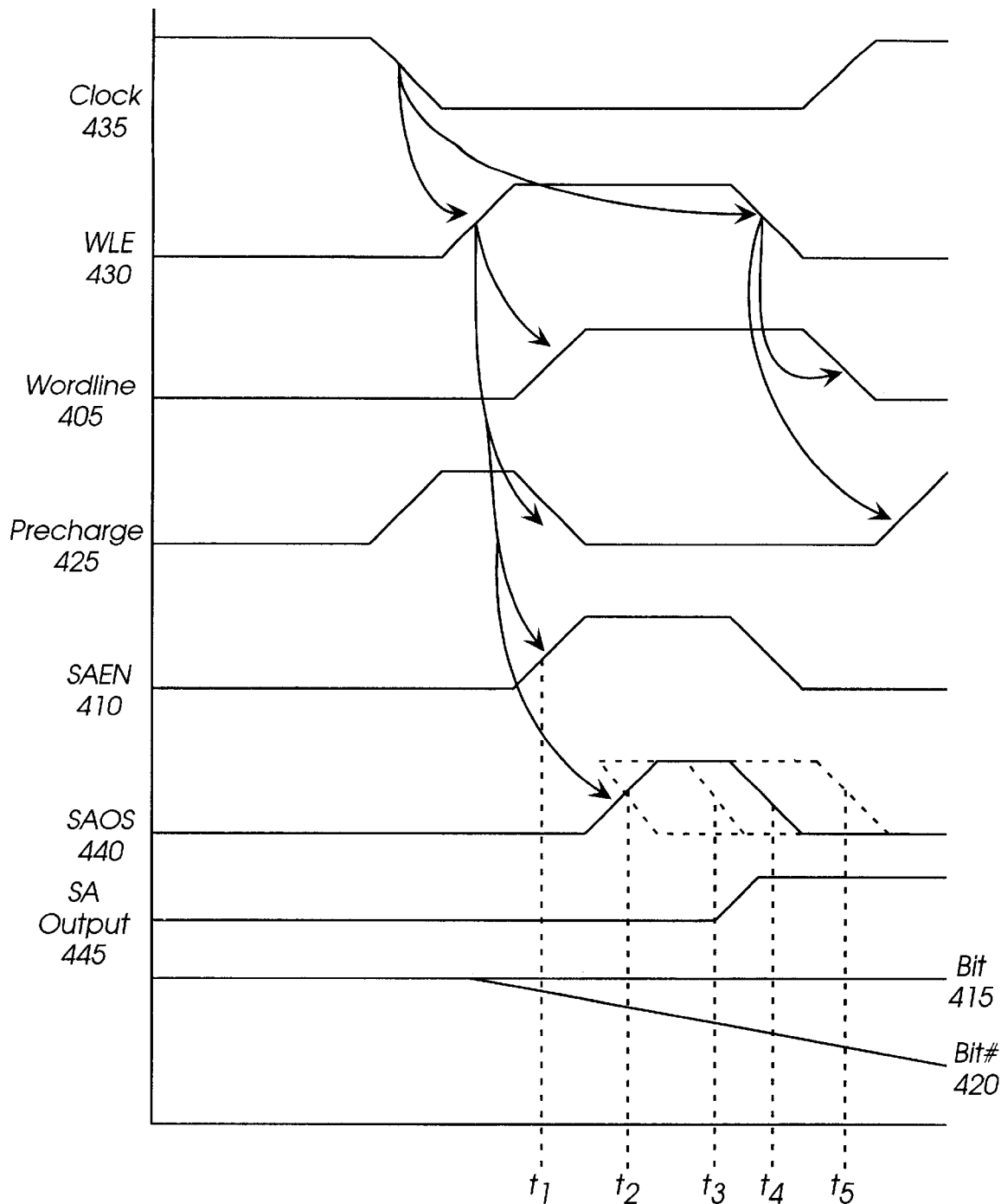
FIG. 5 is a timing diagram illustrating the timing of a programmably delayed sense amplifier output strobe signal according to one embodiment of the present invention.

FIG. 5 is a timing diagram illustrating the timing of a programmably delayed sense amplifier output strobe signal according to one embodiment of the present invention. Variation of the SAOS signal is referred to as the SCT strobe mode of the present invention. FIG. 5 illustrates many of the same timing signals as FIG. 4, however, the SAOS signal 440 is altered rather than the SAEN signal 410.

As discussed above with reference to FIG. 4, during a read operation of the array 106 of FIG. 1, the wordline enable signal 430 is provided to the decoder, which causes the wordline signal 405 to be provided to the particular memory cell to be read. The wordline signal 405 causes the cell to transition the bit signal 415 to the programmed value of the particular cell and the bit# signal 420 to the inverse of the programmed value of the particular cell, from which the sense amplifier 151 senses the value stored in the memory cell.

The SAEN signal 410 is asserted at time $t_1$, at which time the sense amplifier 151 begins to sense the value stored in the memory cell. At time $t_2$, the SAOS signal 440 is asserted to open/connect the latch 154 of FIG. 1. The sense amplifier (SA) output 445 becomes valid between time $t_2$ and time $t_4$. On the falling edge of the SAOS signal 440 (when the SAOS signal 440 transitions from a high state to a low state), at time $t_4$, the latch 154 turns off, latching in whatever value is being received from the sense amplifier 151 at time $t_4$.

The SAOS signal 440 timing can be altered, either by removing delay (e.g., to time $t_3$) or adding delay (e.g., to time $t_5$). The SA output 445 becomes valid between time $t_2$ and $t_4$. Thus, by altering the timing of the SAOS signal 440, the amount of time for the SA output 445 to generate from SAEN 142 can be artificially constrained for testing.

Using the present invention, delay can be removed from the SAOS signal 440, allowing the latch 154 to latch in the value from the sense amplifier 151 at time $t_3$. However, the time $t_3$ can occur so early that the latch 154 never opens, and thus the output of the sense amplifier 151 is never provided as data output 110 (slow sense amps can be identified using this method).

It should be noted that a range of delays could be programmably added by the present invention to cause the SAOS signal 440 to be de-asserted at any one of multiple times between the time $t_3$ and the time $t_5$ of FIG. 5. In the embodiment discussed above with a 128-bit register, 128 different times between the time $t_3$ and the time $t_5$, inclusive, can be programmed.

Figure 6:
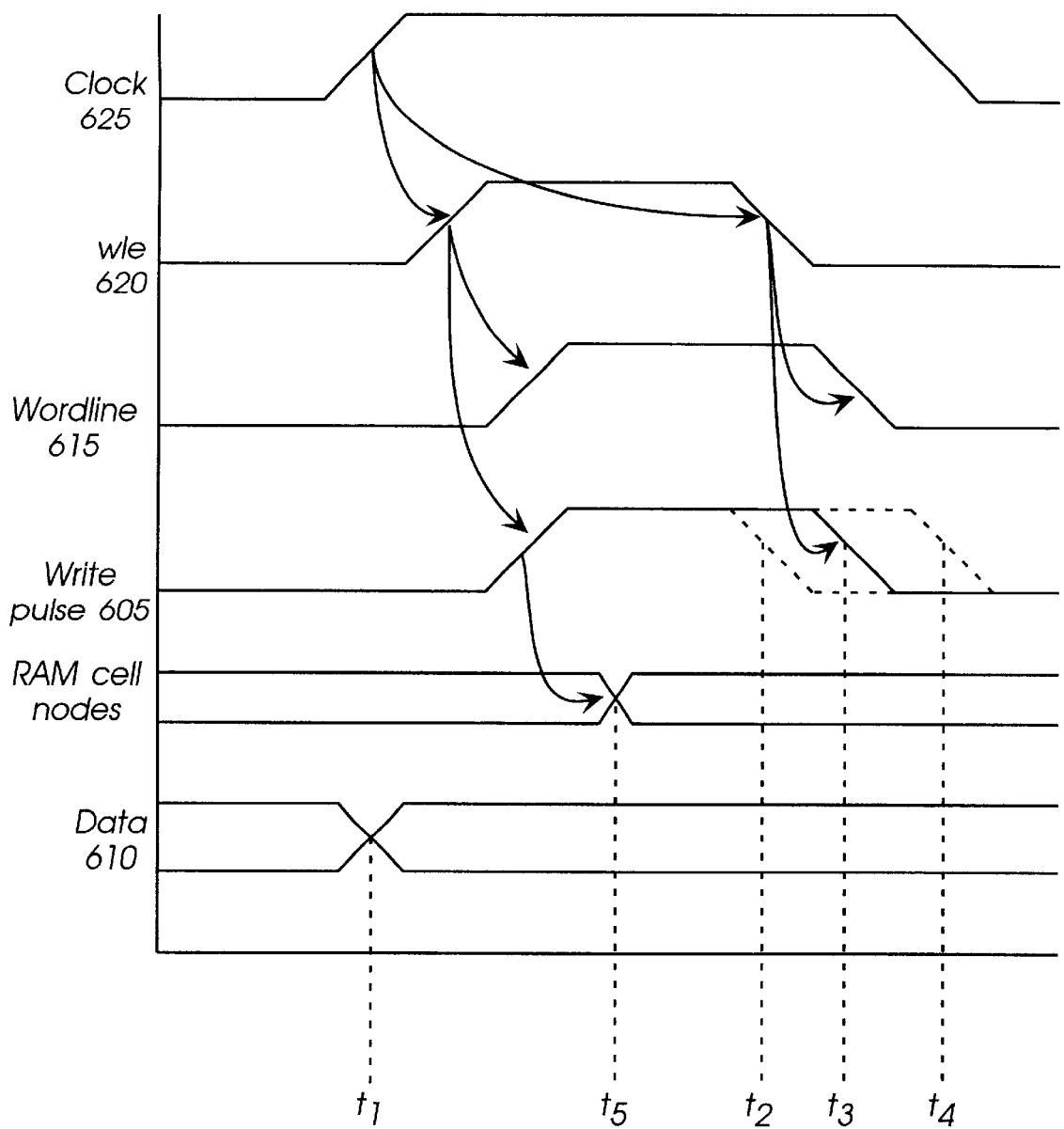
FIG. 6 is a timing diagram illustrating the timing of a programmably delayed write pulse signal according to one embodiment of the present invention.

FIG. 6 is a timing diagram illustrating the timing of a programmably delayed write pulse signal according to one embodiment of the present invention. Variation of the write pulse signal is referred to as the SCT write mode of the present invention.

A write pulse signal 605, data 610, wordline signal 615, writeline enable signal 620, and clock signal 625 are illustrated in FIG. 6. In the illustrated embodiment, the write pulse signal 605, the data 610, the wordline signal 615, the writeline enable signal 620, and the clock signal 625 of FIG. 6 are the write pulse 148, the data input 109, the wordline signal 127, the writeline enable signal 178, and the clock signal 187 of FIG. 1, respectively.

During a write operation to a particular cell of array 106 of FIG. 1, data 610 of FIG. 6 is written to the particular cell. A wordline enable signal 620 is provided to the decoder, which causes the wordline signal 615 to be provided to the particular memory cell to be accessed. The wordline enable signal 620 also causes the assertion of the write pulse signal 605, causing the write drivers to be turned on. Data 610 arrives at time $t_1$, and is provided to the particular memory cell via the write drivers. The assertion of the write pulse signal 605 causes the data 610 to be stored in the particular memory cell at time $t_5$. The write pulse signal 605 transitions to a low state at time $t_3$, causing the write drivers to turn off.

The period between time $t_5$ and the time $t_3$ is referred to as the write margin. Analogous to the read margin discussed above, the write margin provides an additional safety margin to allow the memory cell to store the data despite processing or design variations. Delay can be removed from the write pulse signal 605, causing the write pulse signal to transition to a low state at time $t_2$, and thereby reducing the write margin. This reduced write margin further allows subsequent precharging to start sooner and thus decreases the cycle time of the memory. However, when removing delay from the write pulse signal 605, care should be taken so that the write pulse signal does not transition to a low state before the data is stored in the particular memory cell (that is, time $t_2$ should not be less than time $t_5$).

Furthermore, if time $t_5$ were to be later than time $t_3$, then a delay can be introduced to the write pulse signal 605, thereby causing the write pulse signal 605 to transition to a low state at time $t_4$. By delaying the end of the write pulse signal, additional time is provided to write the data to the memory cell (that is, to "flip" the cell). However, if time $t_5$ were to be later than time $t_3$, then delaying the write pulse signal also makes an otherwise unusable component useable.

It should be noted that a range of delays could be programmably added by the present invention to cause the write pulse signal 605 to be de-asserted at any one of multiple times between time $t_2$ and $t_4$ of FIG. 6. In the embodiment discussed above with a 128-bit register, 128 different times between $t_2$ and $t_4$, inclusive, can be programmed.

Additionally, situations can arise where the write pulse signal 148 is too narrow to allow the cells of the array 106 and/or programmable circuitry 139 to be written to. Thus, according to one embodiment of the present invention, one of two different write pulse signals (one having a narrow pulse width and the other a broader pulse width) can be provided to be programmably delayed as the write pulse signal 148. Selection of one of these two signals can be made in a variety of different manners, such as using a pulse width select signal and logical AND gates analogous to the selection of mobile or desktop configurations discussed above.

It is to be appreciated that any one or more of the three modes (SCT delay mode, SCT strobe mode, and SCT write mode) can be used concurrently. Therefore, any combination of the SAEN signal, the SAOS signal, and the write pulse signal can be altered concurrently in accordance with the present invention.

Thus, the present invention allows signal timing to be precisely controlled, thereby avoiding wasted time and cost in redesigning and refabricating new chips, and reducing the time required to finalize a design. The present invention can also support multiple different environments, allowing different environments with different timing requirements (e.g., lower or higher voltage designs) to be supported by a single chip design. By allowing such precision control over the signal timing, the present invention further allows chips and designs to be evaluated more thoroughly, such as by being able to stress certain components easier and determine the maximum speed of components as well.

Figure 7:
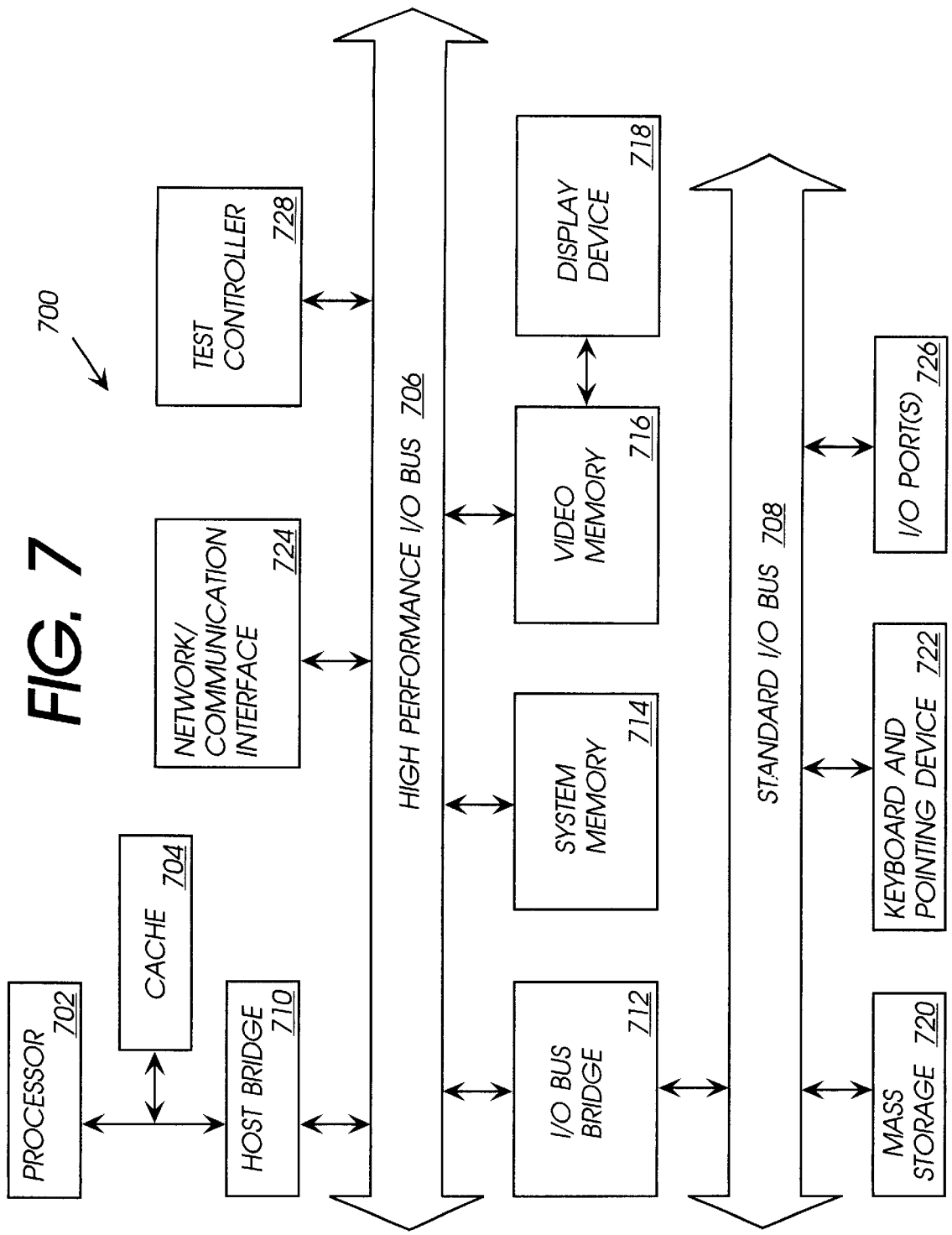
FIG. 7 illustrates a hardware system or machine in which the present invention can be practiced according to one embodiment of the present invention.

FIG. 7 illustrates a hardware system or machine in which the present invention can be practiced according to one embodiment of the present invention. In the illustrated embodiment, hardware system 700 includes processor 702 and cache memory 704 coupled to each other as shown. In one embodiment, processor 702 includes the embedded memory array and associated circuitry of FIG. 1. Additionally, hardware system 700 includes high performance input/output (I/O) bus 706 and standard I/O bus 708. Host bridge 710 couples processor 702 to high performance I/O bus 706, whereas I/O bus bridge 712 couples the two buses 706 and 708 to each other. Coupled to bus 706 are network/communication interface 724, system memory 714, and video memory 716. In turn, display device 718 is coupled to video memory 716. Coupled to bus 708 is mass storage 720, keyboard and pointing device 722, and I/O ports 726. Collectively, these elements are intended to represent a broad category of hardware systems, including but not limited to general purpose computer systems based on the Pentium® processor, Pentium® Pro processor, or Pentium® II processor manufactured by Intel Corporation of Santa Clara, Calif.

These elements 702–726 perform their conventional functions known in the art. In particular, network/communication interface 724 is used to provide communication between system 700 and any of a wide range of conventional networks, such as an Ethernet, token ring, the Internet, etc. It is to be appreciated that the circuitry of interface 724 is dependent on the type of network the system 700 is being coupled to. I/O ports 726 are one or more serial and/or parallel communication ports used to provide communication between additional peripheral devices which may be coupled to hardware system 700.

Test controller 728 provides a user connection to the bus 706 and thus processor 702 for testing purposes. According to one embodiment of the present invention address, data, and control signals can be provided to processor 702 by test controller 728 for testing the embedded memory of processor 702. Alternatively, rather than being coupled to high performance I/O bus 706, test controller 728 could be coupled to a different bus, such as a dedicated "test" bus (not shown).

It should be noted that the programmable delays of the present invention can also be provided to the processor 702 during normal system operation via, for example, patch logic interface 180 of FIG. 1.

It is to be appreciated that various components of hardware system 700 may be re-arranged. For example, cache 704 may be on-chip with processor 702. Alternatively, cache 704 and processor 702 may be packaged together as a "processor module" and attached to a "processor card", with processor 702 being referred to as the "processor core". Furthermore, certain implementations of the present invention may not require nor include all of the above components. For example, mass storage 720, keyboard and pointing device 722, display device 718 and video memory 716, host bridge 710, test controller 728, and/or cache 704 may not be included in system 700. Additionally, the peripheral devices shown coupled to standard I/O bus 708 may be coupled to high performance I/O bus 706; in addition, in some implementations only a single bus may exist with the components of hardware system 700 being coupled to the single bus. Furthermore, additional components may be included in system 700, such as additional processors, storage devices, or memories.

In the discussions above, reference is made to particular signals which are delayed in accordance with the present invention. It is to be appreciated that the present invention is not limited to use with the specifically named signals, and that other signals within the embedded memory array and associated circuitry can be programmably delayed in an analogous manner. Additionally, in alternate embodiments of the present invention, different signals within a processor or other chip can be delayed in a manner analogous to the delay of the signals discussed above.

Additionally, according to one embodiment of the present invention, the programmable delay circuitry 139 is isolated from the system reset signal in a computer system or test environment (e.g., by asserting a signal on a particular pin during reset). Thus, in this embodiment, a hardware or system reset of the system does not cause a loss of the delays programmed into circuitry 139.

Furthermore, in the discussions above, the present invention is described with reference to "rising" and "falling" edges of particular signals. It is to be appreciated that the logical levels of these signals could be reversed, so that rather than a rising edge of a signal causing a particular action (that is, enabling that action) the falling edge of the signal could cause that action. Thus, it is to be appreciated that the "enabling" edge of a signal could be the rising or falling edge of the signal. It is also to be appreciated that the "trailing" edge of the signal could be the rising or falling edge of a signal.

Also in the discussions above, reference is made to certain read and write operations occurring serially or in a single-bit manner. According to alternate embodiments, such operations can occur in a multiple-bit manner (e.g., multiple bits accessed concurrently).

Thus, the present invention allows the timing of various embedded memory control signals to be advantageously programmable by software. Thus, changes to the timings can be quickly and easily made without requiring fabrication of additional chips. Additionally, otherwise unusable components can be made useable.

Thus, a method and apparatus for software controlled timing of embedded memory has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. An integrated circuit comprising:
   an embedded memory array; and
   input/output (I/O) control circuitry coupled to the embedded memory array to provide a plurality of I/O control signals to the embedded memory array to control the input of data to the embedded memory array and output of data from the embedded memory array, wherein the I/O control circuitry includes one or more programmable registers to control the delay associated with each of the individual I/O control signals, the one or more registers to store a value indicating the delay to be imposed on the individual I/O control signals corresponding to the respective registers.

2. The integrated circuit of claim 1, wherein each of the one or more delay registers comprises a column of SRAM cells.

3. The integrated circuit of claim 1, further comprising a control register, coupled to the delay registers, to provide access to the one or more delay registers.

4. The integrated circuit of claim 1, wherein each of the one or more delay registers comprises a plurality of memory cells, each storing one bit, wherein a first set of the plurality of memory cells comprises a first number of cells and wherein a second set of the plurality of memory cells comprises a second number of cells.

5. The integrated circuit of claim 1, wherein for each of the one or more delay registers, an amount of delay introduced by the delay register is dependent on the number of bits set in the delay register.

6. The integrated circuit of claim 1, further comprising a sense amplifier, coupled to the embedded memory array and the I/O control circuitry wherein one of the plurality of I/O signals comprises a sense amplifier enable signal to indicate when to turn on the sense amplifier, and wherein the programmable delay circuitry is operative to alter the timing of an enabling edge of the sense amplifier enable signal.

7. The integrated circuit of claim 1, further comprising an output latch, coupled to the embedded memory array and the I/O control circuitry, to output data from the embedded memory array, wherein one of the plural of I/O signals comprises a sense amplifier output strobe signal to indicate when to turn off the output latch, and wherein the programmable delay circuitry is operative to alter the timing of a trailing edge of the sense amplifier output strobe signal.

8. The integrated circuit of claim 1, further comprising one or more write drivers, coupled to the embedded memory array and the I/O control circuitry, to provide data to the embedded memory array, wherein one of the plurality of I/O signals comprises a write pulse signal, and wherein the programmable delay circuitry is operative to alter the timing of a trailing edge of the write pulse signal.

9. A method comprising:
   storing values in one or more delay registers that indicate a delay to be associated with individual input/output (I/O) signals corresponding to the respective delay registers;
   providing a plurality of I/O control signals to I/O circuitry associated with an embedded memory array; and
   altering the timing of one or more of the plurality of I/O signals to alter the delay of one or more of the I/O signals, in response to values retrieved from corresponding delay registers.

10. The method of claim 9, further comprising altering the timing of an enabling edge of a sense amplifier enable signal to indicate when to turn on a sense amplifier of the I/O circuitry.

11. The method of claim 9, further comprising altering the timing of a trailing edge of a sense amplifier output strobe signal to indicate when to turn off an output latch, to output data from the embedded memory array, of the I/O circuitry.

12. The method of claim 9, further comprising altering the timing of a falling edge of a write pulse signal to one or more write drivers, to provide data to the embedded memory array, of the I/O circuitry.

13. An article comprising a machine-accessible medium to provide instructions that, when executed by one or more processors, cause the one or more processors to:

store values in one or more delay registers that indicate a delay to be associated with individual input/output (I/O) signals corresponding to the respective delay registers;

provide a plurality of I/O control signals to I/O circuitry associated with an embedded memory array; and alter the timing of one or more of the plurality of I/O signals to alter the delay of one or more of the I/O signals, in response to values retrieved from corresponding delay registers.

14. The article of claim 13 further comprising instructions that, when executed by the one or more processors, cause the one or more processors to alter the timing of an enabling edge of a sense amplifier enable signal to indicate when to turn on a sense amplifier to the I/O circuitry.

15. The article of claim 13 further comprising instructions that, when executed by the one or more processors, cause the one or more registers to alter the timing of a trailing edge of a sense amplifier output strobe signal to indicate when to turn off an output latch, to output data from the embedded memory array, of the I/O circuitry.

16. The article of claim 13 further comprising instructions that, when executed by the one or more processors, cause the one or more processors to alter the timing of a falling edge of a write pulse signal to one or more write drivers, to provide data to the embedded memory array, of the I/O circuitry.

* * * * *